United States Patent [19]
Colles

[11] Patent Number: 4,899,154
[45] Date of Patent: Feb. 6, 1990

[54] FLASH COMPARATOR

[75] Inventor: Joseph H. Colles, Oceanside, Calif.

[73] Assignee: Brooktree Corporation, San Diego, Calif.

[21] Appl. No.: 224,871

[22] Filed: Jul. 26, 1988

[30] Foreign Application Priority Data

Aug. 13, 1987 [CH] Switzerland ............... 3120/87

[51] Int. Cl.$^4$ ............................................. H03M 1/36
[52] U.S. Cl. ................................. 341/159; 341/136; 341/158
[58] Field of Search ................ 341/136, 158, 159, 164

[56] References Cited

U.S. PATENT DOCUMENTS

| 4,449,118 | 5/1984 | Dingwall et al. | 341/159 |
| 4,591,830 | 5/1986 | Hanna | 341/159 |
| 4,639,715 | 1/1987 | Doluca | 341/159 |

OTHER PUBLICATIONS

C. M. Horwitz and R. M. Swanson, "The Optical (Free Carrier) Absorption of a Hole-Electron Plasma in Silicon", Solid State Electronics vol. 23, pp. 1191–1194.
T. Tamir et al "Integrated Optics" Springer-Verlag (1975) vol. 7, pp. 17–25, 244–245, 278–285.
R. S. Popovic "Optical Waveguides in Silicon IC Technology".

Primary Examiner—William M. Shoop, Jr.
Assistant Examiner—Gary J. Romano

Attorney, Agent, or Firm—Ellsworth R. Roston; Charles H. Schwartz

[57] ABSTRACT

Input and reference voltages are respectively applied to the control elements of first and second transistors. This causes a substantially constant current to be divided between the first and second transistors in first time periods. In second time periods alternating with the first periods, the reference voltage is also applied to the control element of the first transistor to produce a current representation of the reference voltage. This causes the first and second transistors respectively to produce in the second periods voltages dependent only upon their relative characteristics. These voltages are introduced in the second periods to first and second capacitances to charge the capacitances when first switches such as transistors are closed. Subsequently in the second periods, the charges in the first and second capacitances are respectively transferred to third and fourth capacitances to charge the third and fourth capacitances. The voltages across the third and fourth capacitances are respectively introduced in the first periods to the third and fourth transistors to control the transistor conductivities. The resultant currents produced by the third and fourth transistors are respectively introduced to the first and second transistors in the first periods to compensate for the differences in the characteristics of the first and second transistors. As a result, the voltage difference at the outputs of the first and second transistors in the first periods respectively represent only the difference between the input and reference voltages.

24 Claims, 2 Drawing Sheets

FLASH COMPARATOR

This invention relates to analog-to-digital converters and more particularly to flash comparators for use in such converters. The invention especially relates to flash comparators in which a compensation is provided for any differences in the characteristics of key elements in the comparators.

Digital data processing systems are becoming widespread at a relatively rapid rate. Such data processing systems may receive measurements of such parameters as temperature and pressure in analog form and convert these measurements to a digital form. The data processing systems may then process these parameters and other parameters in digital form and may provide indications in digital form of adjustments to be made in the values of the parameters such as temperatures and pressure. These adjustments may then be converted to an analog form and the adjustments may be made in accordance with the analog indications. In this way, systems may be provided for accurately controlling complex processes in various industries such as the chemical, steel and semi-conductor industries.

Conversions from analog to digital values are generally more complex than conversions from digital to analog values. In analog-to-digital conversions, an input voltage is often compared with progressive values of a reference value. The comparisons are provided in a plurality of flash comparators each of which receives the input voltage and an individual one of the progressive values of the reference voltage. The flash comparator is then selected in which a substantial identity exists between the magnitudes of the input and reference voltages. The reference voltage in this comparator is then converted to a digital value.

Analog-to-digital converters are often provided on integrated circuit chips. These chips are advantageous because they can provide complex circuitry in a small space and because they can be easily duplicated. The chips are also advantageous because they can be manufactured at a relatively low cost and can be considerably refined to approach the high accuracies of the computations provided in the data processing systems.

Although the analog-to-digital converters now in use approach the accuracies provided in the associated data processing systems, they do not match such accuracies. This results in part from the fact that components such as transistors at different positions in an integrated circuit chip do not have the same characteristics. Such differences in characteristics may result from differences in such parameters as the thicknesses of material or from stresses in the chip. Such differences in characteristics provide relatively minor errors in the conversion from analog values to digital values but these minor errors are serious because they limit the accuracy in which the data processing system can control the operation of the system with which it is associated.

As will be appreciated, a considerable amount of effort has been made, and significant sums of money have been expended, to perfect data processing systems. Since analog-to-digital converters tend to limit the accuracy of such data processing systems, a substantial portion of the effort made, and the money expended, to perfect the data processing systems has been directed toward improving the analog-to-digital converters. In spite of such effort and such money expenditures, the analog-to-digital converters now in use are significantly less accurate than the data processing systems with which they are associated.

This invention provides improvements in analog-to-digital converters to enhance the accuracy of such converters. The invention is particularly directed to enhancing the accuracy of the flash comparator included in such converters. This enhanced accuracy is obtained by compensating for any differences in the characteristics of key components such as transistors in the flash comparators. By providing such compensation, a major source of error in such comparators is eliminated or at least minimized.

In a flash comparator constituting one embodiment of the invention, input and reference voltages are respectively applied to the control elements of first and second transistors. This causes a substantially constant current to be divided between the first and second transistors in first time periods in accordance with the relative characteristics of the input and reference voltages.

In second time periods alternating with the first periods, the reference voltage is also applied to the input element of the first transistor. This transistor then produces a current representative of the reference voltage. This causes the first and second transistors respectively to produce in the second periods voltages dependent only upon their relative characteristics. These voltages are introduced in the second periods to first and second capacitances to charge the capacitances when first switches such as transistors are closed.

Subsequently in the second periods, the charges in the first and second capacitances are respectively transferred to third and fourth capacitances to charge the third and fourth capacitances when second switches such as transistors are closed. The charges in the third and fourth capacitances are respectively introduced in the first periods to the third and fourth transistors to control the transistor conductivities.

The resultant currents produced by the third and fourth transistors are respectively introduced to the first and second transistors in the first periods to compensate for the differences in the characteristics of the first and second transistors. As a result, the voltage difference at the outputs of the first and second transistors in the first periods respectively represent only the difference between the input and reference voltages. At the end of each cycle, the outputs of the first and second transistors may be grounded and also may be provided with a common voltage to prepare the transistors for subsequent cycles of operation.

Figure 1:
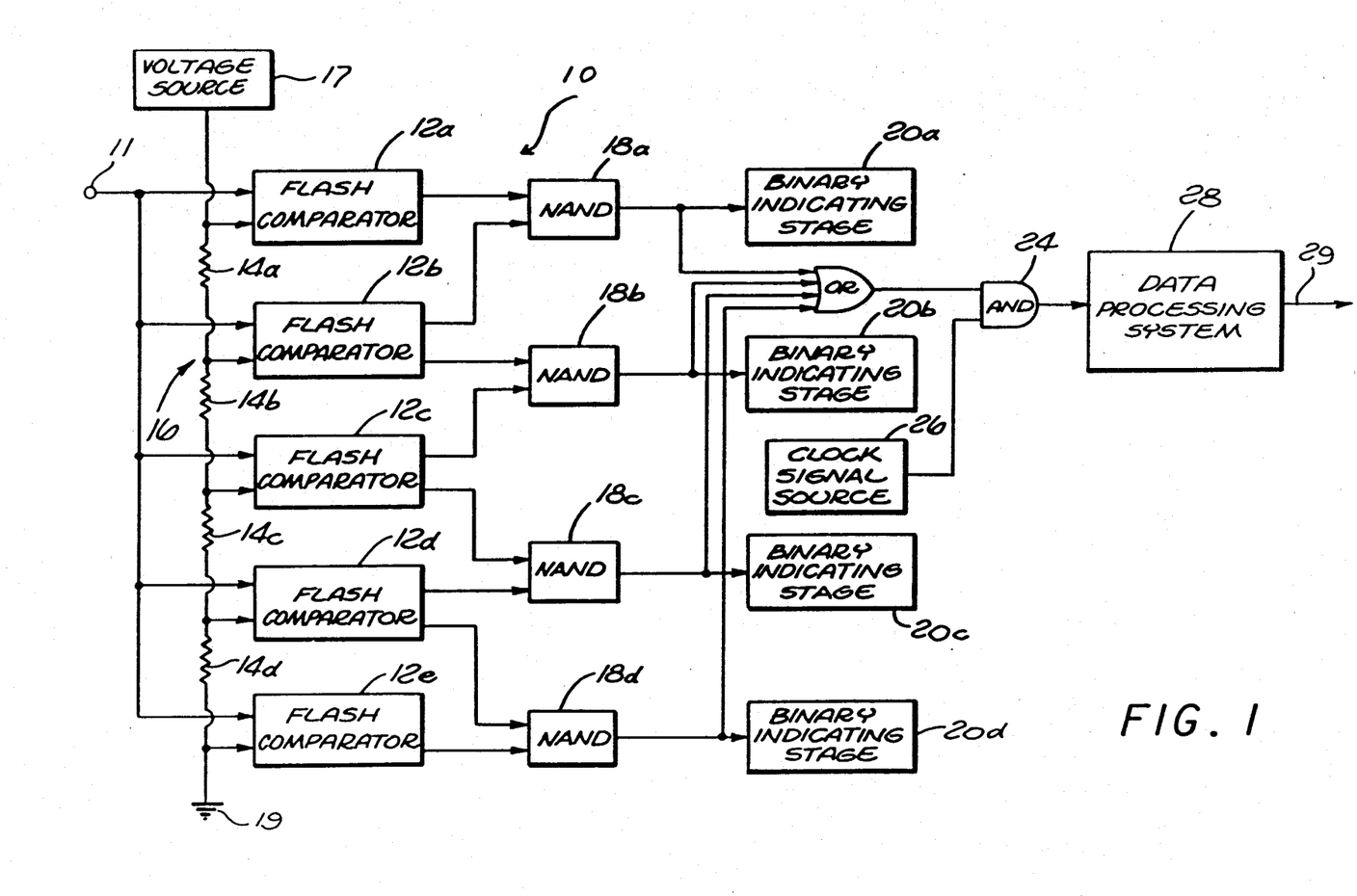
FIG. 1 is a block diagram of an analog-to-digital converter in which a plurality of the flash comparators constituting this invention may be included.

In one embodiment, an analog-to-digital converter is generally indicated at 10 in FIG. 1. In this converter, an input voltage is provided on a line 11. The input voltage may be produced in a conventional manner to represent a variable parameter such as temperature or pressure. The input voltage on the line 11 is introduced to first input terminals of a plurality of flash comparators indicated in block form at 12a, 12b, 12c, etc. A reference voltage is also introduced to second input terminals of each of the flash comparators 12a, 12b, 12c, etc. to provide a comparison in the relative magnitudes of the input and reference voltages. The reference voltage introduced to each of the successive comparators 12a, 12b, 12c etc. in the sequence has a progressive magnitude relative to the magnitude of the voltages introduced to the preceding comparators in the sequence. These progressive magnitudes in the reference voltage are obtained by providing a plurality of resistances 14a, 14b, 14c etc. in series to define a resistance ladder generally indicated at 16 and by connecting one end of the resistance ladder to a voltage source 17 providing a positive voltage such as approximately two volts (2V) and by connecting the other end of the ladder to a common potential such as a ground 19. The second input terminals of the flash comparators 12a, 12b, etc. are respectively connected to the terminals common to the resistances 14a and 14b and the resistances 14b and 14c, etc.

The comparator 12a has one (1) output terminal and each of the comparators 12b, 12c, etc. includes two output terminals. The output terminals from progressive pairs of the comparators 12a, 12b, 12c, etc are connected to "nand" networks 18a, 18b, 18c, etc. in a particular pattern. For example, the output terminal of the comparator 12a and the upper output terminal of the comparator 12b are connected to the "nand" network 18a. Similarly, connections are made to the "nand" network 18b from the lower output terminal of the comparator 12b and the upper output terminal of the comparator 12c.

The outputs from each of the "nand" networks 18a, 18b, 18c, etc., are respectively introduced to associated stages 20a, 20b, 20c, etc. to obtain binary coded indications in a well known manner. The outputs from the "nand" networks 18a, 18b, 18c, etc. are also introduced to an "or" network 22. The signals passing through the "or" network 22 are in turn introduced to an input terminal of an "and" network 24, which also receives signals on a second input terminal from a source 26 of clock signals. The signals from the "and" network 24 pass to a data processing system 28 to indicate to the data processing system that the conversion of the input voltage on the line 11 to binary coded signals representative of such input voltage has been completed.

Each of the flash comparators 12a, 12b, 12c, etc. receives the input voltage on the line 11 and a reference voltage of an individual magnitude from the resistance ladder 16 and compares these voltages. When the input voltage exceeds the reference voltage introduced to the comparator, the comparator produces a voltage of a large magnitude on its upper output terminal and produces a voltage of a low magnitude on its lower output terminal. The comparator produces a voltage of a low magnitude on its upper output terminal and a voltage of a high magnitude on its lower output terminal when the input voltage is less than the reference voltage.

The "nand" networks 18a, 18b, 18c, etc., respectively compare voltages on the opposite terminals of successive pairs of comparators 12a, 12b, 12c, etc. to determine the magnitude of the input voltage relative to the progressive magnitudes of the reference voltages from such successive pairs of comparators. Only one of the "nand" networks 18a, 18b, 18c, etc., is able to pass an output signal at any one time. For example, the "nand" network 18b may pass an output signal. This indicates that the input voltage on the line 11 has a magnitude between the reference voltages on the terminal common to the resistances 14a and 14b and the terminal common to the resistances 14b and 14c.

When a signal passes through one of the "nand" networks such as the "nand" network 18b, it causes a plurality of binary signals to be produced by a particular one of the stages 20a, 20b, 20c, etc. These signals indicate in binary coded form a reference voltage midway between a pair of flash comparators such as the comparators 12b and 12c. The signal from the activated "nand" network such as the network 18b also passes through the "or" network 22 to the "and" network 24. This signal prepares the "and" network 24 to pass the next clock signal from the source 26. This clock signal in turn activates the data processing system 28 to receive the binary coded signals from the activated one of the binary indicating stages such as the stage 20b. The data processing system 28 then processes these signals and presents a binary output code at an appropriate output data bus 29. Such output data bus has a binary output data code corresponding to the analog input signal on the line 11. This data code may be used by other control systems not shown to regulate such parameters as temperature or pressure. In that case, the analog input signal on the line 11 might be derived from a temperature or pressure sensor.

Figure 2:
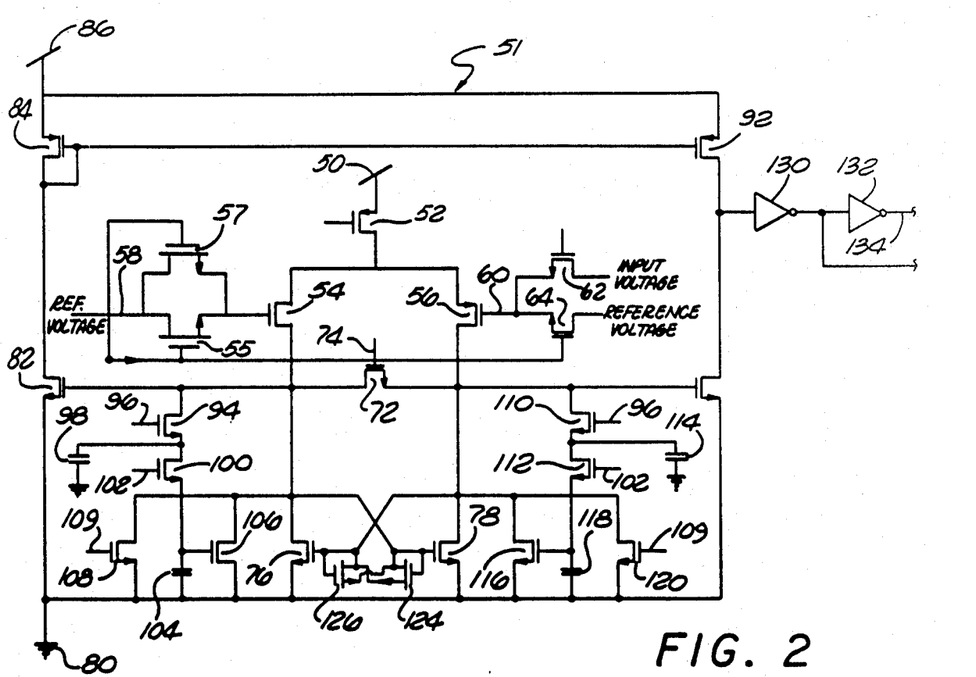
FIG. 2 is a circuit diagram of one embodiment of a flash comparator constituting this invention.

An embodiment of the flash comparator constituting this invention is generally indicated at 51 in FIG. 2. This embodiment includes a source 50 of positive voltage. The source 50 is connected to the source of a pnp transistor 52, the gate of which receives a bias to produce a substantially constant current through the transistor. The drain of the transistor 52 is common with the sources of pair of pnp transistors 54 and 56.

The gate of the transistor 54 is connected to the sources of a pair of transistors 55 and 57, the drains of which receive a reference voltage on a line 58. The gates of the transistors 55 and 57 receive a switching signal. The transistors 55 and 57 may be of the n-channel type. The gate of the transistor 56 receives a voltage on a line 60 which is common with the sources of a pair of n-channel transistors 62 and 64. The gates of the transistors 62 and 64 receive switching signals, the gate of the transistor 64 being connected to the gates of the transistors 55 and 57. The transistor 62 is activated in first time periods to pass the input voltage and the transistor 64 is activated, in second time periods alternating with the first time periods, to pass the reference voltage. The transistors 62 and 64 provide a balanced relationship with the transistors 55 and 57.

The drain and the source of an n channel transistor 72 are respectively connected to the drains of the transistors 54 and 56 and the gate of the transistor 72 is connected to receive reset pulses on a line 74. Connections are also made from the drain of the transistor 54 to the drain of an n-channel transistor 76 and the gate of an n-channel transistor 78 and from the drain of the transistor 56 to the drain of the transistor 78 and the gate of the transistor 76. The sources of the transistors 76 and 78 are connected to a reference potential such as a ground 80.

The drain of the transistor 54 is also common with the gate of an npn transistor 82, the source of which receives the reference potential such as the ground 80. The drain of the transistor 82 is connected to the drain and the gate of a p-channel transistor 84. The source of the transistor 84 receives a positive potential from a voltage source 86. Similarly, the drain of the transistor 56 is connected to the gate of an n-channel transistor 90, the source of which is grounded as at 80. A connection is made from the drain of the transistor 90 to the drain of a p-channel transistor 92. The gate of the transistor 92 is common with the gate of the transistor 84 and the source of the transistor 92 receives the positive voltage from the voltage source 86.

The drain of the transistor 54 is common with the drain of an n-channel transistor 94. The gate of the transistor 94 receives a pulse on a line 96 at a first particular time in the second time periods. The source of the transistor 94 is connected to one terminal of a capacitance 98, the other terminal of which is grounded. The source of the transistor 94 is also connected to the drain of an n-channel transistor 100, the gate of which receives a pulse on a line 102 at a second particular time in the second time periods.

The source of the transistor 100 is also common with one terminal of a capacitance 104, the other terminal of which receives the reference potential such as the ground 80. The value of the capacitance 104 is larger than the value of the capacitance 98. The potential on the source of the transistor 100 is also applied to the gate of an n-channel transistor 106, the source of which receives the reference potential such as the ground 80. The drains of the transistor 106 and of a transistor 108 are common with the drain of the transistor 54. The source of the transistor 108 is connected to the reference potential such as the ground 80 and reset pulses are applied to the gate of the transistor 108 through a line 109. The transistor 108 may be of the n-channel type.

In like manner, the voltage on the drain of the transistor 56 is applied to the drain of a transistor 110, the gate of which receives the pulses on the line 96. The source of the transistor 110 and the drain of an n-channel transistor 112 are common with one plate of a capacitance 114, the other terminal of which receives the reference potential such as the ground 80. The gate of the transistor 112 receives the pulses on the line 102.

The source of the transistor 112 and the gate of an n-channel transistor 116 are connected to one plate of a capacitance 118, the other plate of which receives the reference potential such as the ground 80. The values of the capacitances 114 and 118 may respectively correspond to the values of the capacitances 98 and 104. The source of the transistor 116 also receives the reference potential such as the ground 80 and the drain of the transistor 116 has the same potential as the drain of the transistor 56. The gate of the transistor 116 receives the potential on the ungrounded plate of the capacitor 118. The source and the drain of an n-channel transistor 120 are respectively common with the source and drain of the transistor 78. Pulses are applied through the line 109 to the gate of the transistor 120.

The drain of the transistor 106 is common with the drain and the gate of a transistor 124 which may be of the n-channel type. Similarly, the drain of the transistor 116 may be common with the drain and the gate of a transistor 126 which may also be of the n-channel type. The sources of the transistors 124 and 126 may be respectively connected to the drains of the transistors 126 and 124. The transistors 124 and 126 effectively serve as diodes.

During the positive half of each clock signal 200, a voltage pulses is introduced to the gate of the transistor 72 to make the transistor conductive. The clock signals are illustrated at 200 in FIG. 3. When the transistor 72 becomes conductive, it provide the drains of the transistors 76 and 78 with substantially the same potential. This insures that any differences between the voltages on the drains of the transistors 76 and 78 will be relatively small before a cycle of operation is commenced. The difference between the voltages on the drains of the transistors 76 and 78 is illustrated at 202 in FIG. 4.

Figure 3:
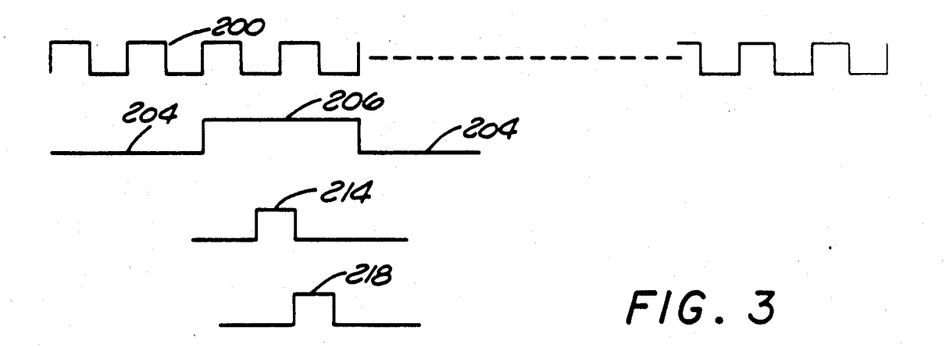
FIG. 3 is a diagram illustrating voltage waveforms at strategic terminals in the flash comparator shown in Figure 2.
Figure 4:
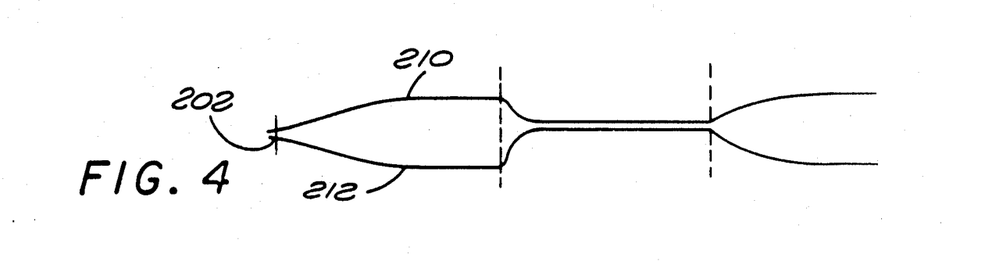
FIG. 4 illustrates, on a time scale expanded relative to the time scale of FIG. 3, the voltage difference between a pair of transistors included in the circuit diagram of FIG. 2.

During the production of the positive half of some of the clock signals 200, the clock signals 200 may be introduced to the gates of the transistors 108 and 120 as well as to the gate of the transistor 72. The voltage pulses introduced to the transistors 108 and 120 cause the transistors to become highly conductive so that the voltages on the drains of these transistors approach the ground potential on the sources of the transistors. Because of the interrelationship between the transistors 108 and 76 and between the transistors 120 and 78, the voltages on the drains of the transistors 76 and 78 also approach the ground potential on the sources of the transistors.

In the negative half cycles of the clock signals 200, the voltage on the gates of the transistors 72, 108 and 120 falls to a value near the ground potential 80, and the transistors 72, 108 and 120 become non-conductive. During a time period 204 in FIG. 3, a positive pulse is introduced to the gate of the transistor 62. Since the input voltage on the line 11 in FIG. 1 is introduced to the drain of the transistor 62, the transistor 62 accordingly becomes conductive so that the input voltage is introduced to the gate of the transistor 56. The reference voltage is also simultaneously introduced from one of the terminals in the resistance network 16 in FIG. 1 through the line 58 in FIG. 2 to the drains of the transistors 55 and 57. For example, the reference voltage may be obtained from the terminal common to the resistances 14a and 14b in FIG. 1. The transistors 55 and 57 accordingly become conductive and introduce the reference voltage to the gate of the transistor 54.

The transistors 56 and 54 become conductive in accordance with the relative magnitudes of the input and reference voltages. For example, when the magnitude of the input voltage on the drain of the transistor 62 exceeds the magnitude of the reference voltage on the line 58, the transistor 54 becomes more conductive than the transistor 56. This causes the constant current through the transistor 52 to be divided in a manner such that the current through the transistor 54 exceeds the current through the transistor 56.

Because of the difference in drain current between the transistors 54 and 56, the voltage on the gate of the transistor 78 rises faster than the voltage on the gate of the transistor 76. This causes the transistor 78 to be more conductive than the transistor 76. As a result, the gate of the transistor 76 is pulled closer to the ground potential 80 than the gate of the transistor 78. The low voltage on the gate of the transistor 76 decreases the conductivity in the transistor 76. The voltage on the drain of the transistor 78 accordingly increases. This voltage is introduced to the gate of the transistor 78 to increase the conductivity of the transistor 78.

The high voltage on the gate of the transistor 78 is introduced to the gate of the transistor 82 to make the transistor 82 conductive. This causes the voltage on the drain of the transistor 82 to drop. This voltage is introduced to the gate of the transistor 84 to increase the conductivity of the transistors 84 and 92 simultaneously. At the same time, the relatively low voltage on the gate of the transistor 76 is introduced to the gate of the transistor 90. This causes the transistor 90 to become much less conductive than the transistor 82. Because of this, the drain of the transistor 92 rises to a positive potential approaching the potential on the voltage source 86. This positive voltage is introduced to an amplifier-inverter 130. The positive voltage is inverted by the amplifier-inverter 130 and inverted a second time by an amplifier-inverter 132 to introduce a positive voltage to an output line 134.

When the magnitude of the input voltage on the drain of the transistor 62 is less than the magnitude of the reference voltage on the line 58, the transistor 56 becomes more conductive than the transistor 54. This causes the voltage on the gate of the transistor 76 to rise faster than the voltage on the gate of the transistor 78 and the transistor 76 to be more conductive than the transistor 78. The voltage on the drain of the transistor 78 is accordingly higher than the voltage on the drain of the transistor 76. The high voltage on the drain of the transistor 78 causes the transistor 90 to be conductive and a low voltage to be produced on the output line 134.

At second time periods 206 (FIG. 3) alternating with the first time periods 204, the pulses on the gate of the transistor 62 are eliminated and positive pulses are introduced into the gate of the transistor 64. This causes the transistor 62 to become non-conductive and the transistor 64 to become conductive. The reference voltage is accordingly introduced through the transistor 64 to the gate of the transistor 56.

Since the transistors 54 and 56 receive the same reference potential, the constant current flowing through the transistor 82 should theoretically be divided equally between the transistors 54 and 56. However, the transistors 54 and 56 do not often have identical characteristics. This may result from the formation of the transistors 54 and 56 from different thicknesses of material on an integrated circuit chip or it may result from stresses in the chip. Since the transistors 54 and 56 do not have identical characteristics, an unbalance results in their operation. For example, an unbalance in the operation of the transistors 54 and 56 may result because the threshold voltage of one of the transistors is different from the threshold voltage of the other transistor.

If the threshold voltage of the transistor 56 is significantly greater than the threshold voltage of the transistor 54, the current passed by the transistor 54 should exceed the current passed by the transistor 56. This should cause the voltage on the gate of the transistor 78 to rise faster than the voltage on the gate of the transistor 76. The higher voltage on the gate of the transistor 78 increases its conductivity. This drives the gate of the transistor 78 toward ground. At the same time, the decrease in the current in the transistor 76 and an increase in the voltage on the source of the transistor cause the difference in voltages on the drains of the transistors 76 and 78 to become increasingly pronounced. The increasing voltage on the drain of the transistor 76 and the decreasing voltage on the drain of the transistor 78 during the second time periods 206 are respectively illustrated at 210 and 212 in FIG. 3.

After the difference in the voltages on the drains of the transistors 76 and 78 has reached a maximum value in the second time periods 206, pulses are applied on the line 96 to the gates of the transistors 94 and 110 during the second time periods 206 to make these transistors conductive. These pulses are illustrated at 214 in FIG. 3. Currents accordingly flow through a circuit including the drain of the transistor 76, the transistor 94 and the capacitance 98 and a circuit including the drain of the transistor 78, the transistor 110 and the capacitance 114. These currents respectively charge the capacitances 98 and 114. The relative charges produced in the capacitances 98 and 114 are dependent upon the relative voltages on the drains of the transistors 76 and 78.

Pulses are introduced on the line 102 to the gates of the transistors 100 and 112 during the second time periods 206 shortly after the pulses 214 on the gates of the transistors 94 and 110 have been interrupted. The pulses introduced to the gates of the transistors 100 and 112 are indicated at 218 in FIG. 3. The pulses 218 cause the transistors 100 and 112 to become conductive. The charge in the capacitance 98 accordingly becomes transferred into the capacitance 104 through the transistor 100. Similarly, the charge in the capacitance 114 is transferred through the transistor 112 into the capacitance 118. Since the capacitances 104 and 118 are respectively larger than the capacitances 98 and 114, a few cycles of operation may have to occur before the charges in the capacitances 104 and 118 reach an equilibrium value.

The voltage across the capacitance 104 is introduced to the gate of the transistor 106 to control its conductivity. The conductivity of the transistor 106 is therefore dependent upon the charge in the capacitance 104. An increase in the conductivity of the transistor 106, can reduce the impedance from the gate of the transistor 78 to ground. An increase in the conductivity of the transistor 116 resulting from an increase in the charge on the capacitance 118 reduces the impedance from the gate of the transistor 76 to ground.

When the threshold of the transistor 56 is higher than the threshold of the transistor 54, the charge in the capacitance 104 is greater than the charge in the capacitance 118 and the conductivity of the transistor 106 is greater than the conductivity of the transistor 116. The impedance to ground presented by the transistor 106 to the gate of the transistor 78 is accordingly lower than the impedance presented by the transistor 116 to the gate of the transistor 76. The transistor 106 accordingly tends to shunt current from the transistor 54 away from the gate of the transistor 76. In this way, the excess current from the transistor 54 resulting from its reduced threshold is shunted away from the gate of the transistor 76 and the gates of the transistors 76 and 78 tend to charge in a balanced manner, thereby correcting for the threshold induced imbalance in the currents of the transistors 54 and 56.

The transistors 124 and 126 effectively serve as diodes because the gate and drain of each of the transistors are common. The transistors may provide maximum voltages of approximately one and one half volts (1.5V.) and accordingly may provide average voltages of approximately three quarters of a volt (0.75V.). The voltage across the transistor 126 limits the voltage on the gate of the transistor 76. Similarly, the voltage across the transistor 124 limits the voltage on the gate of the transistor 78.

The voltages across the transistors 124 and 126 are effective in insuring that only one of the transistors 104 and 116 will be conductive at any instant and that the other transistor will be non-conductive at that instant. This results from the fact that the voltage (1.5V.) introduced by one of the transistors (e.g. the transistor 126) to the drain of the associated transistor (e.g. the transistor 116) is sufficient to make that transistor conductive. However, the voltage (e.g. 075V.) introduced from the other transistor (e.g. the transistor 124) to the drain of the associated the transistor (e.g. the transistor 106) is insufficient to produce a flow of current through that transistor.

As a result of the inclusion of the circuitry shown in FIG. 2, the difference between the voltages on the drains of the transistors 76 and 78 during the first time periods 204 tends to indicate only the difference between the input and reference voltages. This results from the fact that the circuitry shown in FIG. 2 compensates during the time periods 206 for any differences in the characteristics of the transistors 54 and 56. Because the charge on the capacitors 104 and 118 may be held for a number of conversion cycles in which only the input signal is sampled, correction cycles during the time periods 206 of FIG. 2 may be performed with much less frequency than input sampling. Therefore, a correction cycle is not required for each sampling cycle and increased accuracy is provided with little sacrifice in the speed of operation of the flash comparator.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination in a flash comparator,
   means for providing an input voltage,
   means for providing a reference voltage,
   first means operative at first particular times for producing a first current in accordance with the magnitude of the input voltage,
   second means for producing a second current in accordance with the magnitude of the reference voltage,
   first terminal means responsive to the first current for producing a first voltage in accordance with the magnitude of the first current,
   second terminal means responsive to the second current for producing a second voltage in accordance with the magnitude of the second current,
   the first means being responsive to the reference voltage at second particular times different from the first particular times to produce a third current in accordance with the magnitude of the reference voltage,
   means responsive to any difference between the magnitudes of the second and third currents during the second particular times to provide voltages compensating for any such difference, and
   means responsive to the compensating voltages for introducing such compensating voltages to the first and second terminal means in the first particular times to provide a compensation in the first time periods of any differences between the magnitudes of the second and third currents in the second time periods.

2. In a combination as set forth in claim 1,
   the compensating means including first and second capacitances and means operative during the second particular times for respectively charging the first and second capacitances in accordance with the voltages on the first and second terminal means during such second particular times.

3. In a combination as set forth in claim 2,
   means responsive to the charges across the first and second capacitances for shunting the currents in the first and second means during the second particular times to compensate during the first particular times for any imbalances produced in the first and second means during the second particular times.

4. In a combination as set forth in claim 3,
   means responsive to the differences in the voltages respectively produced on the first and second terminal means during the first particular times for indicating the relative magnitudes of the input and reference voltages.

5. In combination in a flash comparator,
   means for providing an input voltage,
   means for providing a reference voltage,
   a first transistor,
   a second transistor,
   means for providing a constant current,
   means including the first transistor for providing at first particular times through the first transistor a portion of the constant current dependent upon the relative characteristics Claim 5 - Continued of the input and reference voltages and upon the relative characteristics of the first and second transistors,
   means including the second transistor for providing at the first particular times through the second transistor a portion of the constant current dependent upon the relative characteristics of the reference and input voltages and upon the relative characteristics of the second and first transistors,
   means including the first transistor and a first capacitance for charging the first capacitance, at second particular times different from the first particular times, in accordance with the relative characteristics of the first and second transistors,
   means including the second transistor and a second capacitance for charging the second capacitance at the second particular times in accordance with the relative characteristics of the second and first transistors,
   means for introducing to the first transistor, during the first particular times, a voltage inversely related to the charge in the first capacitance to compensate for the relative differences in the characteristics of the first and second transistors, and
   means for introducing to the second transistor, during the first particular times, a voltage inversely related to the charge in the second capacitance to compensate for the relative differences in the characteristics of the second and first transistors.

6. In a combination as set forth in claim 5, Claim 6 - Continued
   means including first switching means responsive to the charge in the first capacitance during the second times for producing a first voltage inversely related to such charge,
   means including second switching means responsive to the charge in the second capacitance during the second times for a second voltage inversely related to such charge,
   means for introducing the first voltage to the first transistor during the first particular times to compensate for the relative difference in the characteristics of the first and second transistors, and
   means for introducing the second voltage to the second transistor during the first particular times to compensate for the relative differences in the characteristics of the second and first transistor.

7. In a combination as set forth in claim 5,
third and fourth transistors having first, second and third electrodes,
the first transistor being connected to the second electrode of the fourth transistor and the first electrode of the third transistor and the second transistor being connected to the second electrode of the third transistor and the first electrode of the fourth transistor to emphasize any difference between the input and reference voltages during the first particular period.

8. In a combination as set forth in claim 7,
the voltage inversely related to the charge in the first capacitance being introduced to the second electrode of Claim 8 - Continued the fourth transistor and the first electrode of the third transistor
the voltage inversely related to the charge in the second capacitance being introduced to the second electrode of the third transistor and the first electrode of the fourth transistor.

9. In combination in a flash comparator,
means for providing an input voltage,
means for providing a reference voltage,
first means responsive to the input voltage for producing in first particular time periods a voltage dependent upon the relative magnitudes of the input and reference voltages,
second means responsive to the reference voltage for producing in the first particular time periods a voltage dependent upon the relative magnitudes of the reference and input voltages,
the voltages respectively produced by the first and second means during the first particular time periods being also dependent upon the relative characteristics of the first and second means,
third and fourth means cross connected to emphasize any differences between the input and reference voltages in any differences in the voltages produced by the first and second means,
fifth means for introducing the reference voltage to the first means in second particular time periods alternating with the first time periods,
sixth means responsive to any differences in the characteristics of the first and second means in the second particular time periods for introducing a voltage to the first means in the first particular time periods to compensate for such differences in the voltage produced by the first means in the first particular time periods, and
seventh means responsive to any differences in the characteristics of the second and first means in the second particular time periods for introducing a voltage to the second means in the first particular time periods to compensate for such differences in the voltage produced by the second means in the first particular time periods.

10. In a combination as set forth in claim 9,
a first capacitance,
the sixth means including means for producing a charge of the first capacitance during the second particular time periods in accordance with the differences in the characteristics of the first and second means and for providing for a discharge of the first capacitance through the first means in the first particular time periods, and
a second capacitance, the seventh means including means for producing a charge of the second capacitance during the second particular time periods in accordance with the differences in the characteristics of the second and first means and for providing for a discharge of the second capacitance through the second means in the first particular time periods.

11. In a combination as set forth in claim 10,
each of the first, second, third and fourth means including a separate transistor.

12. In a combination as set forth in claim 9,
a first capacitance,
a second capacitance having a larger value than the first capacitance,
the sixth means for the first means including means for producing a charge of the first capacitance during the second particular time periods in accordance with the differences in the characteristics between the first and second means, means for producing a discharge of the first capacitance into the second capacitance during the second particular time periods,
means for producing a discharge of the second capacitance to the first means during the first time periods,
a third capacitance, and
a fourth capacitance having a larger value than the third capacitance,
the seventh means for the second means including means for producing a charge of the first capacitance during the second particular time periods in accordance with the differences in the characteristics between the second and first means, means for producing a discharge of the third capacitance into the fourth capacitance during the second particular time periods and means for producing a discharge of the fourth capacitance to the first means during the first particular time periods.

13. In combination in a flash comparator,
a first transistor,
means for providing an input voltage,
a second transistor,
means for providing a reference voltage,
first means including the first transistor responsive to the input voltage for producing in first particular time periods a voltage dependent upon the relative magnitudes of the input and reference voltages and upon the relative characteristics of the first and second transistors,
second means including the second transistor responsive to the reference voltage for producing in the first time periods a voltage dependent upon the relative magnitudes of the reference and input voltages and upon the relative characteristics of the second and first transistors,
third and fourth transistors respectively included in the first and second means and cross connected to emphasize any differences between the magnitudes of the input and reference voltages and between the characteristics of the first and second transistors in the first particular time periods,
third means for applying the reference voltage to the second transistor in second time periods alternating with the first time periods to obtain the production by the second transistor of a voltage dependent upon the relative characteristics of the second and first transistors, fourth means responsive to the differences in the voltages from the first and second transistors in the second particular time periods for respectively producing voltages during the second particular time periods for introduction to Claim 13 - Continued the first and second transistors during the first particular time periods to compensate for the differences in the characteristics of the first and second transistors, and means responsive to the compensating voltages for introducing such compensating voltages to the first and second transistors during the first particular time periods to compensate for the differences in the characteristics of the first and second transistors.

14. In a combination as set forth in claim 13,
the third means including capacitance means and first switching means having open and closed states and normally operative in the open state and connected in a circuit with the capacitance means to obtain a charging of the capacitance means with the switching means closed and including means for closing the switching means in the second particular time periods, and the fourth means including second switching means having open and closed states and operative in the open state to provide for the introduction of the compensating voltages to the first and second transistors state during the first particular time periods.

15. In a combination as set forth in claim 13,
the capacitance means including first capacitance means and second capacitance means having a larger capacity than the first capacitance means and the switching means including first and second switching means having open and closed states and being normally disposed in the open states, the first Claim 15 - Continued capacitance means being connected to receive charges in accordance with the relative characteristics of the first and second transistors with the first switching means in the open state and the second capacitance means being connected to receive charges from the first capacitance means being connected to receive charges in the first capacitance means with the second switching means in the closed state, and means for closing the first and second switching means sequentially at particular times in the second particular time periods, the fourth means being responsive to the voltages from the second capacitance means in the first particular time periods to compensate in the voltages in the first and second means for any differences in the characteristics of the first and second transistors.

16. In a combination as set forth in claim 14,
there being reset periods in each cycle of the first and second particular time periods,
means for resetting the first and second means during the reset periods between the first time periods and the second time periods to eliminate any differences in the voltages from the first and second means, and means for resetting the first and second means in the reset periods to a reference level.

17. In a combination as set forth in claim 15,
there being reset periods in each cycle the first and second time periods, Claim 17 - Continued means connected between the first and second means for providing a connection between the first and second means in the reset periods to eliminate any differences in the voltages from the first and second means, and means connected across the third and fourth transistors for short circuiting the third and fourth transistors during the reset periods to set the voltages from the first and second means to a reference level.

18. In combination in a flash comparator,
means for providing an input voltage,
means for providing a reference voltage,
means for providing a substantially constant current,
means for providing a first line,
means for providing a second line,
a first transistor in the first line,
a second transistor in the second line,
means for providing a division of the substantially constant current between the first and second lines in first particular time periods to produce voltages at the first and second transistors in accordance with the relative magnitudes of the input and reference voltages and in accordance with the relative characteristics of the first and second transistors, means for providing a division of the substantially constant current between the first and second lines, in second particular time periods alternating with the first particular time periods, in accordance with the relative characteristics of the first and second transistors and for respectively providing Claim 18 - Continued voltages at the first and second transistors in accordance with the relative magnitudes of such currents, means responsive to the voltages at the first and second transistors during the second particular time periods for producing voltages in the second particular time periods to compensate for the differences in the voltages at the first and second transistors during the second particular time periods, and means responsive to the compensating voltages for introducing the compensating voltages to the first and second transistors during the first particular time periods to compensate for the differences in the characteristics of the first and second transistors.

19. In a combination as set forth in claim 18,
the means for producing the compensating voltages including capacitance means and means for normally de-activating the capacitance means and means for charging the capacitance means in the second particular time periods in accordance with the relative characteristics of the first and second transistors, and the voltage-compensating means including transistor means responsive to the charges in the capacitance means for producing a conductivity in the transistor means in accordance with such charges to obtain the production of the compensating voltages at the first and second transistors during the first particular time periods.

20. In a combination as set forth in claim 19, Claim 20 - Continued
third and fourth transistors,
means for cross connecting the third and fourth transistors to emphasize in the first time periods the differences in the voltages produced at the first and second transistors in accordance with the relative magnitudes of the input and reference voltages, and the capacitance means including first capacitance means and second capacitance means having a greater storage capacity than the first capacitance means and the means for producing the compensating voltages including means for normally de-activating the first and second capacitance means and further including means for initially activating the first capacitance means in the second particular time periods and for subsequently activating the second capacitance means in the second particular time periods and additionally including means for charging the first capacitance means in accordance with the relative voltages at the first and second transistors during the activation of the first capacitance means and also including means for providing for a discharge of the charge from the first capacitance means into the second capacitance means during the activation of the second capacitance means in the second particular time periods, the voltage-compensating means producing a conductivity in the first and second transistors in the first particular time periods in accordance with the charges in the second capacitance means.

21. In a combination as set forth in claim 20, Claim 21 - Continued the dividing means including third and fourth transistors respectively disposed in the first and second lines and respectively responsive to the voltages from the first and second transistors in the first particular time periods to become conductive, and to provide voltages at the first and second transistors, in accordance with the relative magnitudes of the input and reference voltages and to provide for the flow of currents in the first and second lines in accordance with their relative conductivities.

22. In a combination as set forth in claim 21, each of the third and fourth transistors having a gate, a source and a drain and the source of each of the third and fourth transistors being connected to the gate of the other one of the third and fourth transistors and the output from the first transistor being introduced to the gate of the third transistor and the source of the fourth transistor and the output of the second transistor being introduced to the gate of the fourth transistor and the source of the third transistor.

23. In a combination as set forth in claim 5, means connected to the first and second transistors for insuring that a compensating voltage will be applied to only one of the first and second transistors at any time.

24. In a combination as set forth in claim 20, means connected to the first and second transistors Claim 24 - Continued for insuring that the compensating voltages will be applied to only one of the first and second transistors at any time.

* * * * *